United States Patent [19]
Minegishi

[11] Patent Number: 5,966,297
[45] Date of Patent: Oct. 12, 1999

[54] LARGE BANDWIDTH ANALOG ISOLATION CIRCUIT

[75] Inventor: Atsushi Minegishi, Tokyo, Japan

[73] Assignee: Iwatsu Electric Co., Ltd., Tokyo, Japan

[21] Appl. No.: 09/090,235

[22] Filed: Jun. 4, 1998

[30] Foreign Application Priority Data

Aug. 28, 1997 [JP] Japan ................................. 9-247687

[51] Int. Cl.⁶ .......................... H02M 3/335; H02M 3/18; H03F 3/38; H03F 17/00
[52] U.S. Cl. ................................. 363/24; 363/61; 330/10; 330/59
[58] Field of Search ........................ 330/59, 10; 327/129; 363/24, 25, 26, 60, 61

[56] References Cited

U.S. PATENT DOCUMENTS

| | | | |
|---|---|---|---|
| 4,050,028 | 9/1977 | Vosteen | 330/10 |
| 4,439,821 | 3/1984 | Grippe | 363/26 |
| 4,937,468 | 6/1990 | Shekhawat et al. | 363/26 |
| 4,945,464 | 7/1990 | Gunn | 363/61 |
| 5,519,306 | 5/1996 | Itoh et al. | 363/26 |

*Primary Examiner*—Robert Pascal
*Assistant Examiner*—Patricia T. Nguyen
*Attorney, Agent, or Firm*—Oblon, Spivak, McClelland, Maier & Neustadt, P.C.

[57] ABSTRACT

A large bandwidth analog isolation circuit is disclosed. Isolation transformers (11, 12) isolate the nonfloating side on the right hand from the floating side on the left hand. The input signal (1a, 1b) and a high frequency sinusoidal signal (3a, 3b) via a transformer (16) from an oscillator (18) are applied to a multiplier (20). The floating multiplied signal is supplied to a nonfloating multiplier (60). Thereby, the signal (6a, 6b) is multiplied by the high frequency sinusoidal signal (8a, 8b). The nonfloating multiplied signal (9a, 9b) is obtainable and is filtered (67, 68) to send out the output signal (2a, 2b) reproduced from the input signal (1a, 1b). Thus, replica of the input signal is obtained in the nonfloating side.

14 Claims, 14 Drawing Sheets

LARGE BANDWIDTH ANALOG ISOLATION CIRCUIT

BACK GROUND OF THE INVENTION

1. Field of the Invention

The present invention relates to a large bandwidth analog isolation circuit.

The invention is particularly concerned with a circuit usable between a floating target to be measured and a grounded voltage measuring instrument.

A large bandwidth analog voltage difference of between two points on the floating target can be measured in an insulated state. The analog voltage difference signal, of which bandwidth is DC to 100s MHz, is observable by using the novel isolation circuit.

2. Description of the Prior Art

The floating measurement to measure a voltage difference of between two floating points not grounded is frequently required in the field of electric motors or electric power instruments. The accurate and safe floating measurement is sometimes landed in difficulties, because the floating points to be measured are often on high potentials. It is especially difficult to accurately measure very high frequency signals or very small amplitude differential signals on same phase large amplitude signals.

Such difficulties frequently appear in case of measurements using instruments such as oscilloscopes. In such a case, oscilloscopes not grounded are usually used in the floating state. In case of use of oscilloscopes not grounded, following problems occurs.

It is the first problem that the potential of metal covers of oscilloscopes are put the same potential as that to be measured and there are the possibilities of electric shocks.

It is the second problem that floating circuits tend to cause measured waveforms ringing or itself destroyed. When oscilloscopes are connected to circuits, capacitances between oscilloscopes and the ground cause the ringing waveforms and instantaneous excess currents in circuits.

It is needed to prevent such troubles that the floating circuits to be measured have to be electrically insulated from oscilloscopes by using analog isolation circuits. In prior art analog isolation circuits, a synchronous detection is usually employed. Therein, an analog signal to be observed is modulated by multiplying by a square wave clock.

Shown in FIG. 1 is a prior art analog isolation circuit. In FIG. 2, there are waveforms various points of the circuit shown in FIG. 1.

An input signal of FIG. 2(a) inputted at an input terminal 1 of FIG. 1 is applied to a modulator 202 through an input buffer 201. An oscillator 18B outputs a square wave clock of FIG. 2(b) to a terminal 19. An isolation transformer 12 applies the square wave clock to the modulator 202. Therein, the square wave clock of FIG. 2(b) is operant as a modulation clock. The modulator 202 multiplies the input signal of FIG. 1(a) by the modulation clock of FIG. 2(b) to obtain a modulated output of the modulator 202 as shown in FIG. 2(c).

An isolation transformer 11 applies the modulated signal of FIG. 2(c) to a demodulator 203. The square wave clock from the oscillator 18B is applied to the demodulator 203 in which the square wave clock operates as a demodulation clock. The demodulator 203 multiplies the modulated signal of FIG. 2(c) by the demodulation clock of FIG. 2(b) to produce a demodulated output of FIG. 2(d).

The demodulated output includes the spike noise as shown in FIG. 2(d). The high frequency spectra of the spike noise are the same as those of the square wave clock. A low-pass filter 204 filters out the spike noise to obtain an output of FIG. 2(e) from an output terminal 2 through an output buffer 205. The isolation transformers 11 and 12 isolate a floating modulation side from a nonfloating demodulation side generally grounded.

Thus, two isolation transformers 11 and 12 can isolate the analog output signal of the output terminal 2 from the input signal of the input terminal 1 so as to reproduce the output analog signal of FIG. 2(e) from the input analog signal of FIG. 2(a). In FIG. 1, two kinds of ground characters mean that each ground of the floating modulation side and the nonfloating demodulation side is insulated.

The above-mentioned prior art analog isolation circuit multiplies signals by square wave clock in modulation and demodulation. So, the square wave clock has to include no sag or no overshoot.

It is, therefore, required that not only the oscillator 18B generates the square wave clock with no sag and no overshoot but also the isolation transformer 12 transforms the square wave clock without wave distortions. Such the oscillator 18B and the isolation transformer 12 can operate up to 100s kHz at the highest.

Accordingly, the bandwidth of the analog input signal to be modulated at the modulator 202 is about 100 kHz which is much lower than the repetition rate of the square wave clock. It is, therefore, impossible to measure a high repetition rate signal.

There is another insulation circuit employing an optocoupler. The circuit can not observe high repetition rate signals enough, because the bandwidth of the optocoupler accurately isolating analog signals is 1 MHz at the highest.

A wide band isolation circuit employing an optocoupler and an isolation transformer is disclosed in the following U.S. Patent.

U.S. Pat. No. 5,517,154 "SPLIT-PATH LINEAR ISOLATION CIRCUIT APPARATUS AND METHOD"

The U.S. Patent discloses a circuit isolating analog signal of DC to 100 MHz. Therein, a optocoupler isolates a low path of DC to 100 kHz, and an isolation transformer isolates a high path of 100 kHz to 100 MHz crossing over the passband of the low path. So, the circuit isolates an analog signal of DC to 100 MHz.

In the above-mentioned circuit, there are two problems to be resolved.

It is the first problem that it is difficult to obtain enough large bandwidth. The bandwidth of the optocoupler is 1 MHz at the widest. The crossover frequency is 100 kHz at the highest. It is, therefore, difficult to obtain enough high high-pass cutoff frequency. So, a small size isolation transformer is not employable. A large size transformer is usable at low frequency range, however, it is not good in its high frequency response. It is unsuitable for wide bandwidth use.

It is the second problem that it is required to accurately adjust gains of low and high frequency ranges isolated and crossed over, in order to prevent crossover distortions.

SUMMARY OF THE INVENTION

An object of the invention is to provide a novel large bandwidth analog isolation circuit.

Another object of the invention is to provide an isolation circuit to obtain a floating large bandwidth signal as a nonfloating signal.

A further object of the present invention is to provide a large bandwidth isolation circuit which is isolatable from DC to very high frequency range without employing large size isolation transformers of low high-pass cutoff frequencies. So, isolated large bandwidth signals are obtainable.

In the circuit of the invention, it includes a floating multipliers, a nonfloating multiplier, low-pass filters, a sinusoidal oscillator and small size isolation transformers. The floating multiplier multiplies a floating analog input signal by a floating sinusoidal signal provided isolately from the sinusoidal oscillator so as to obtain a floating multiplied signal.

One of isolation transformers transforms isolately the floating multiplied signal to a nonfloating input signal. Another isolation transformer transforms a sinusoidal signal from the sinusoidal oscillator to the isolated sinusoidal signal.

The nonfloating multiplier multiplies the nonfloating input signal by the nonfloating sinusoidal signal from the sinusoidal oscillator so as to obtain a nonfloating multiplied signal.

The low-pass filters filter the nonfloating multiplied signal out residual sinusoidal signals so as to obtain a nonfloating reproduced analog output signal. Thus, the floating analog input signal is reproduced as the nonfloating reproduced analog output signal.

The isolation transformers transform only high frequency signals, accordingly transformed signals have no waveform distortions. The transformers require small size magnetic cores instead of large size magnetic cores.

Therefore, a large bandwidth of DC to several hundred MHz is obtainable in the isolated state.

Additional objects and advantages of this invention will be apparent from the following detailed description of preferred embodiments thereof that proceed with reference to the accompanying drawings.

BRIEF DESCRIPTION OF THE DRAWINGS

The principle construction and operation of the present invention will be clearly understood from following detailed description taken in conjunction with the accompanying drawings, in which:

FIG. 4 is a waveform diagram showing an operation of the circuit of FIG. 3 for showing the principle in accordance with the present invention;

DESCRIPTION OF THE PREFERRED EMBODIMENTS

The present invention will be described herein under in detail with reference to the accompanying drawings.

Figure 1:
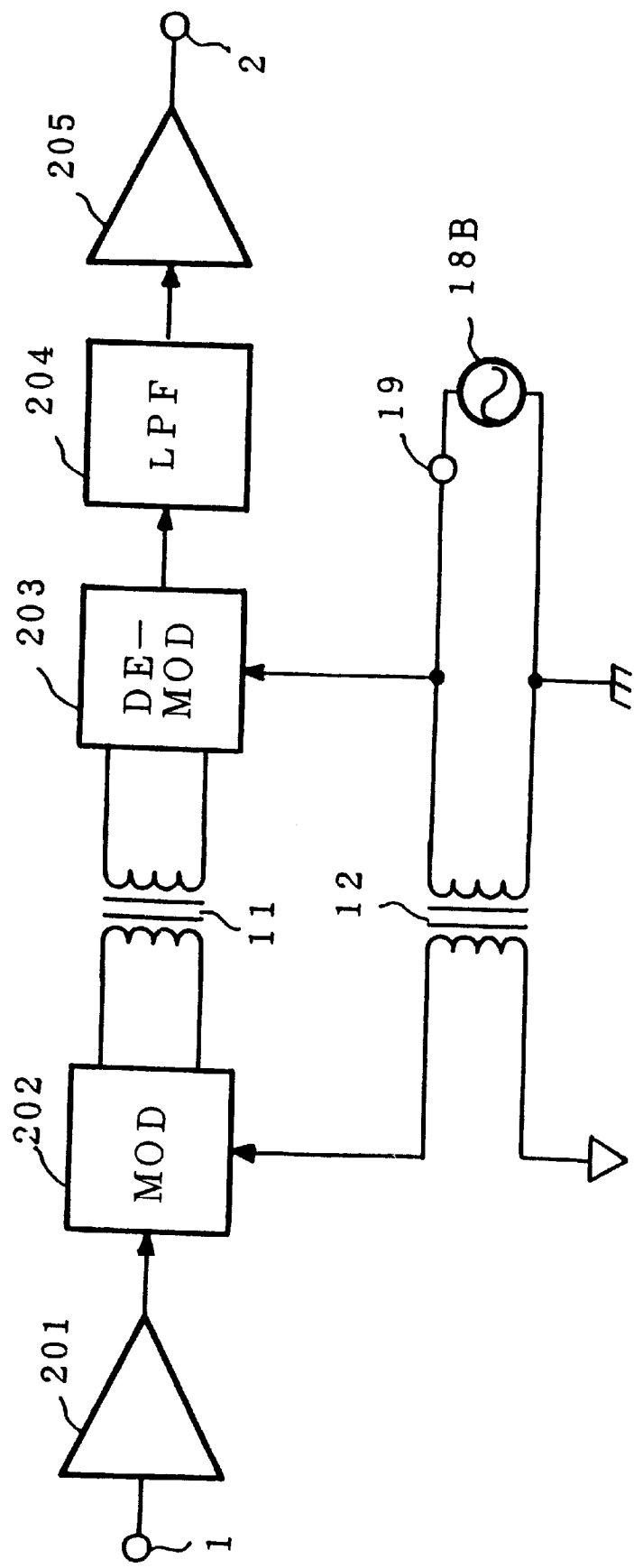
FIG. 1 is a schematic diagram of an isolation circuit in accordance with the prior art.
Figure 2:
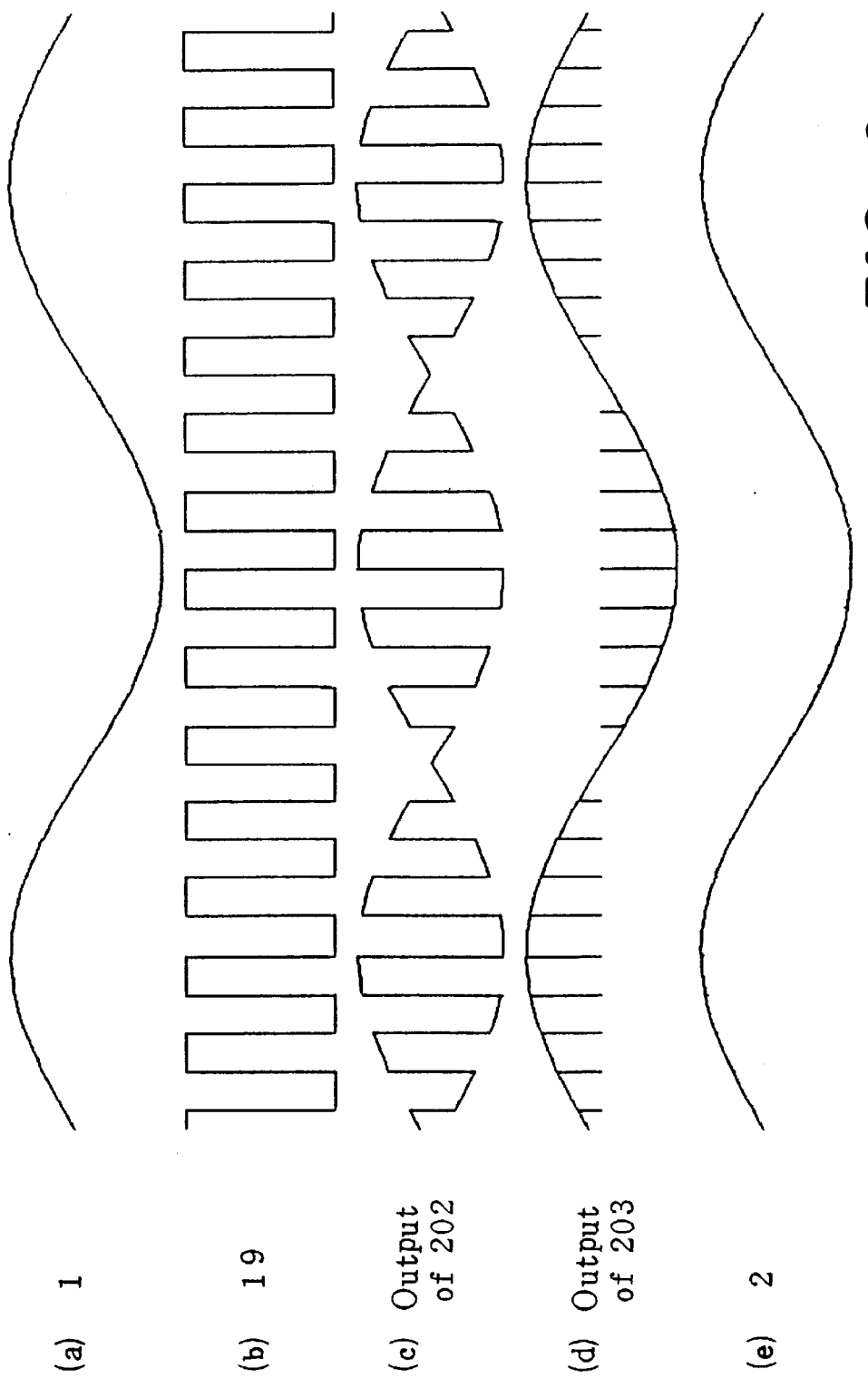
FIG. 2 is a waveform diagram showing an operation of the circuit in accordance with the prior art.
Figure 3:
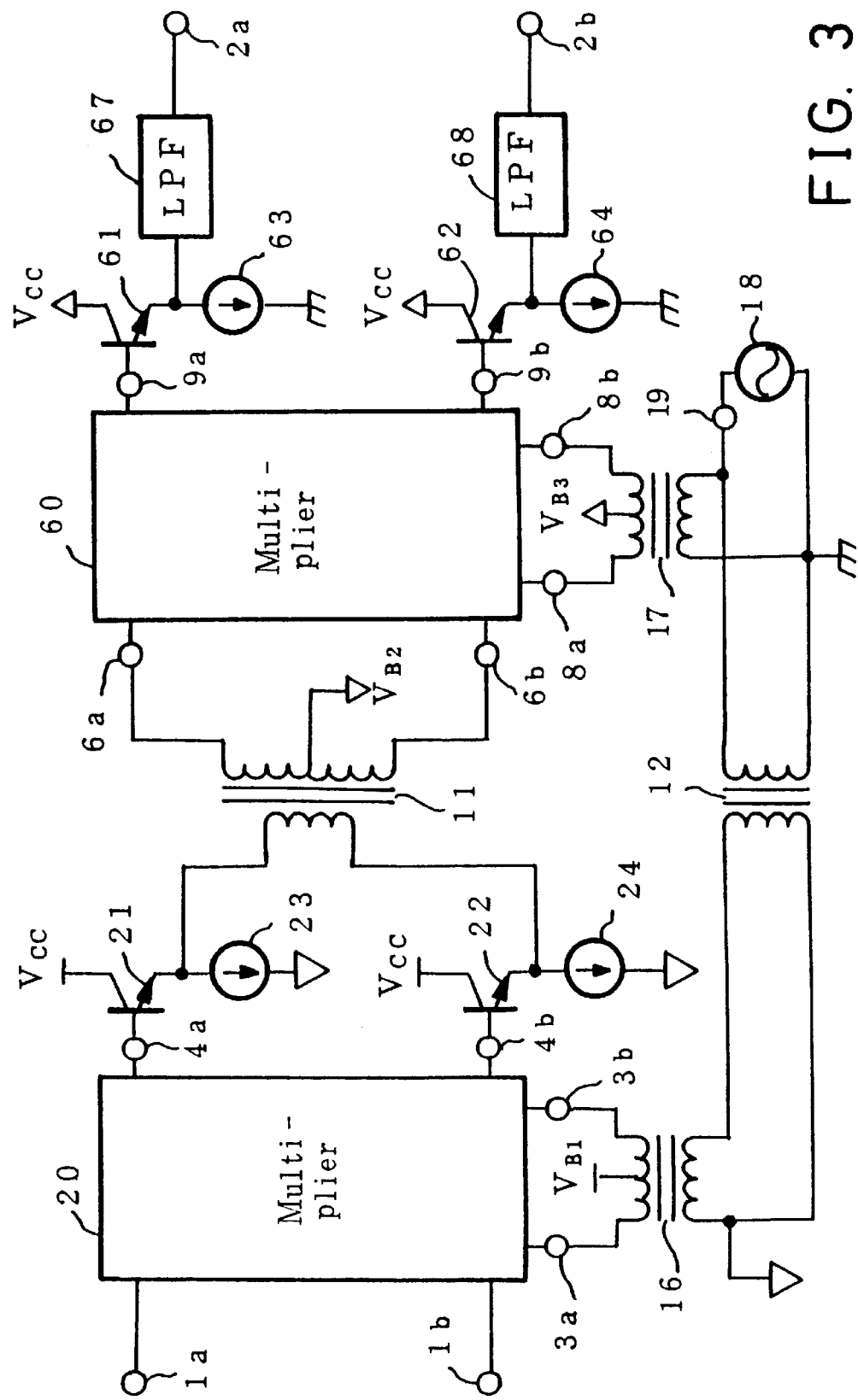
FIG. 3 is a schematic diagram of an isolation circuit in accordance with the present invention.

FIG. 3 shows the first embodiment of an isolation circuit in accordance with the present invention. In FIG. 3, elements similar to those previously described with reference to FIG. 1 are denoted by the same reference numerals. Therein, two kinds of grounding characters and two kind of power source marks mean that a floating side is isolated from a nonfloating side similar to those of FIG. 1.

In the floating side of FIG. 3, differential input terminals 1a and 1b are connected with differential inputs of a floating multiplier 20. The floating multiplier 20 has the other two differential input terminals 3a and 3b supplied differential high frequency sinusoidal signals.

An unbalanced-to-balanced transformer 16 has an unbalanced primary winding. A center tap of the secondary winding supplies a bias voltage $V_{B1}$ of the floating side to the multiplier 20 through the terminals 3a and 3b.

The primary winding of the transformer 16 supplies the differential high frequency sinusoidal signal to the terminals 3a and 3b via the secondary winding. An oscillator 18 of the nonfloating side oscillates a high frequency sinusoidal signal to supply it to the primary winding of the floating transformer 16 through an isolation transformer 12.

The multiplier 20 multiplies the analog signal of input terminals 1a and 1b by the high frequency sinusoidal signal of terminals 3a and 3b to obtain a multiplied signal between terminals 4a and 4b. The multiplied signals at terminal 4a and 4b are respectively applied to two emitter followers of transistors 21 and 22, and constant current sources 23 and 24.

The emitter followers connected between a floating power supply $V_{CC}$ and a floating ground apply the multiplied signals to a primary winding of an isolation transformer 11. The transformer 11 isolates the floating side from the nonfloating side.

A nonfloating multiplier 60 has the same circuit as that of the floating multiplier 20. Nonfloating differential input terminals 6a and 6b are connected with secondary winding outputs. The secondary winding of the isolation transformer 11 applies the multiplied signal to the multiplier 60. A center tap of the secondary winding is connected with a nonfloating bias voltage $V_{B2}$.

The floating multiplier 60 has the other two differential input terminals 8a and 8b supplied differential high frequency sinusoidal signals.

An unbalanced-to-balanced transformer 16 has an unbalanced primary winding. A center tap of the secondary winding supplies a bias voltage $V_{B3}$ of the nonfloating side to the multiplier 60 through the terminals 8a and 8b.

The primary winding of the transformer 17 supplies the differential high frequency sinusoidal signal to the terminals 8a and 8b via the secondary winding. The oscillator 18 of the nonfloating side oscillates a high frequency sinusoidal signal to supply it to the primary winding of the nonfloating transformer 17.

The multiplier 60 multiplies the analog signal of input terminals 6a and 6b by the high frequency sinusoidal signal of terminals 8a and 8b to obtain a multiplied signal between terminals 9a and 9b. The multiplied signals at terminals 9a and 9b are respectively applied to two emitter followers of transistors 61 and 62, and constant current sources 63 and 64.

The emitter followers connected between a nonfloating power supply $V_{CC}$ and a nonfloating ground apply the multiplied signals to low-pass filters 67 and 68. The filters 67 and 68 filter out high frequency spectra of the high frequency sinusoidal signal so as to obtain a nonfloating analog signal reproduced from the floating analog input signal of terminals 1a and 1b at output terminals 2a and 2b.

Figure 4:
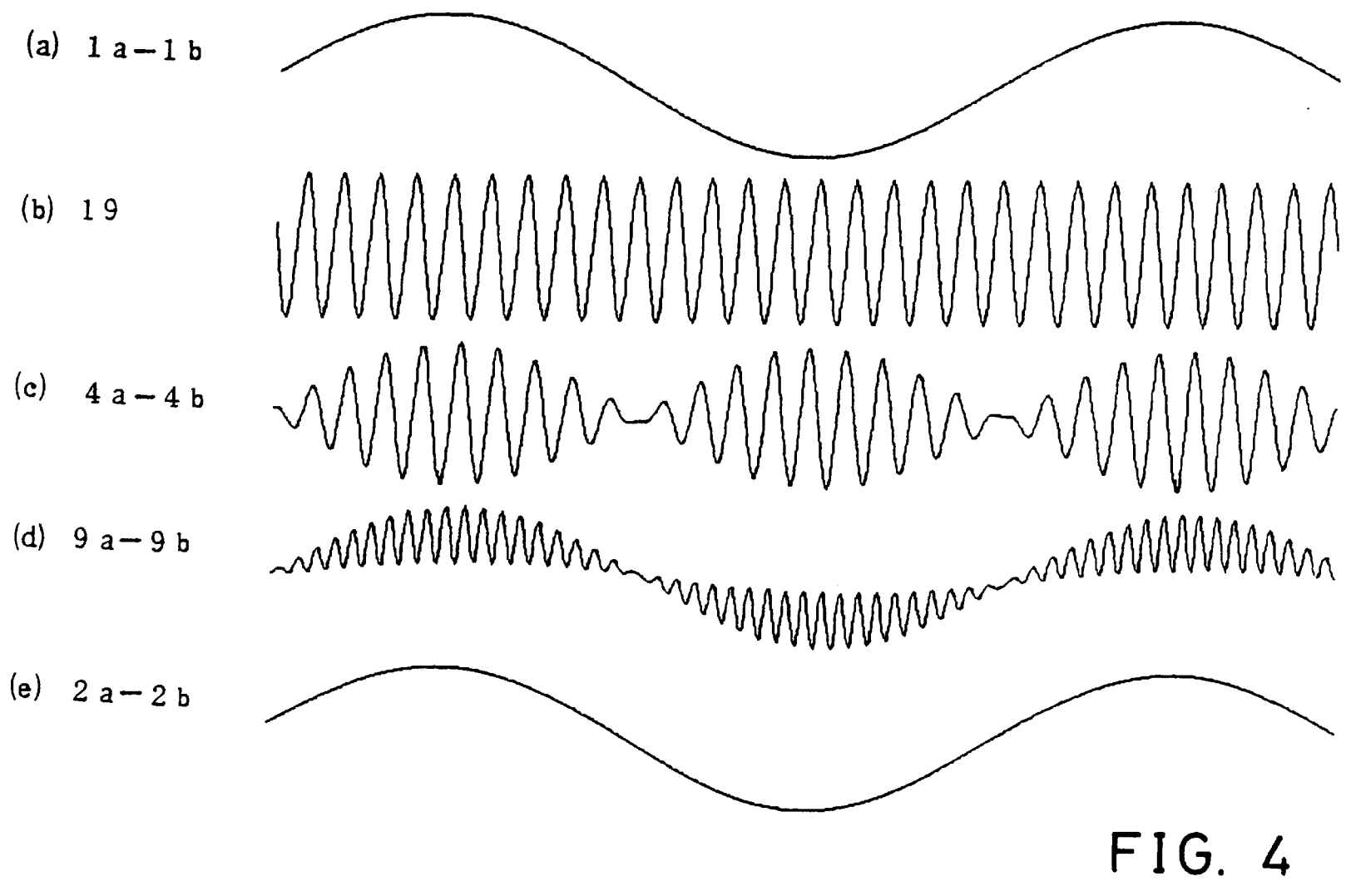

FIG. 4 shows waveforms of various portions of the circuit of FIG. 3. FIGS. 4(a) to (e) show respectively the floating analog input signal between terminals 1a and 1b, the high frequency sinusoidal signal at the terminal 19, the floating multiplied signal between terminals 4a and 4b, the nonfloating multiplied signal between terminals 9a and 9b, and the nonfloating analog reproduced signal between terminals 2a and 2b.

Following relationships will be obtainable among the input signal $E_A$ of terminals 1a and 1b, the high frequency sinusoidal signal $E_B$ of the terminal 19, and the floating multiplied signal $E_C$ of terminals 4a and 4b.

$$E_A = f(t) \quad (1)$$

$$E_B = \sin(\omega t) \quad (2)$$

$$E_C = E_A E_B = f(t) \sin(\omega t) \quad (3)$$

The signal $E_C$ of Equation (3) of terminals 4a and 4b is applied to the nonfloating multiplier 60 via terminals 6a and 6b. The sinusoidal signal $E_B$ of Equation (2) of terminals 8a and 8b is supplied to the multiplier 60 through the transformer 17, too. The nonfloating multiplier 60 operates same as the floating multiplier 20 does.

Therefore, the nonfloating multiplied signal $E_D = E_B E_C$ of terminals 9a and 9b is obtainable as a following equation.

$$E_D = f(t) \sin^2(\omega t) = (1/2) f(t)(1 - \cos(2 \omega t)) \quad (4)$$

When spectra of the input signal $E_A = f(t)$ are lower than the frequency of the sinusoidal signal $E_B = \sin(\omega t)$, let's assume that a cutoff frequency of low-pass filters 67 and 68 is lower than $2\omega t$.

As the result, $$\cos(2 \omega t) = 0$$

and, $$E_D = (1/2) f(t)$$

are obtained. The $E_D = (1/2) f(t)$ means the reproduced signal of terminals 2a and 2b as shown in FIG. 4(e).

In spite of the fact that the floating inputs 2a and 2b are perfectly isolated from the floating inputs 1a and 1b by the isolation transformer 11, the analog signal of a large bandwidth of DC to a very high frequency range is reproducedly obtained.

Figure 5:
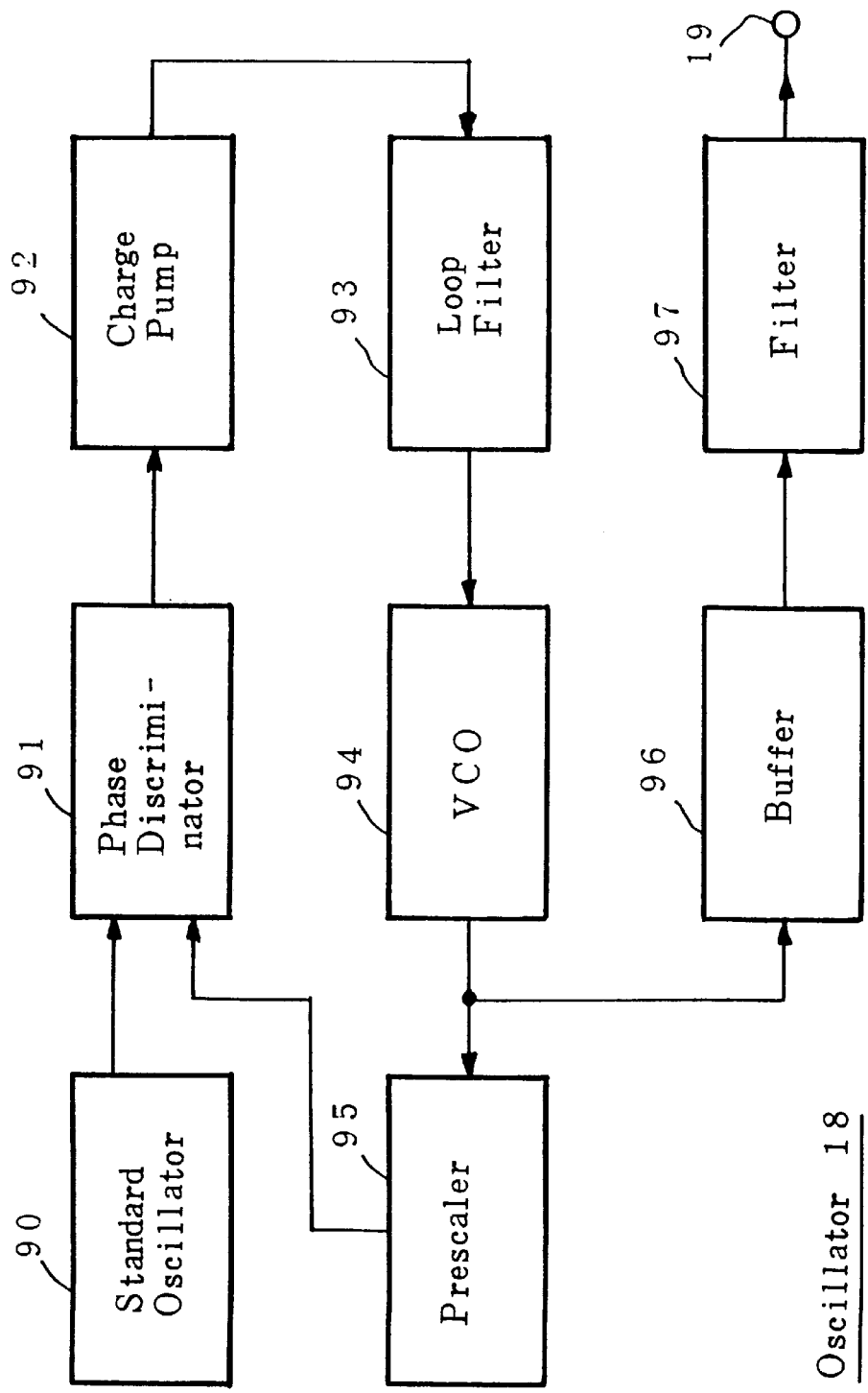
FIG. 5 is a block diagram of an oscillator of one of elements of FIG. 3 in accordance with the present invention.

FIG. 5 shows a block diagram of the high frequency sinusoidal oscillator 18 of one of elements of FIG. 3. Therein, a voltage controlled oscillator 94 applies its high frequency output signal to a prescaler 95. The prescaler 95 divides the high frequency of the output of the oscillator 94 to a low enough frequency to operate a phase discriminator 91.

The phase discriminator 91 discriminates the phase difference between the divided signal of the prescaler 95 and a standard signal of a standard oscillator 90 so as lo obtain analog phase difference signal corresponding to the phase difference. The analog phase difference signal is applied to the voltage controlled oscillator 94 for frequency control through a charge pump 92 charging up and a loop filter 93 filtering out noises.

The loop is called a phase-locked loop (PLL). The output of the voltage controlled oscillator 94 is phase-locked to the phase of the standard oscillator 90. The accuracy of the output frequency of the voltage controlled oscillator 94 depends on that of the standard oscillator 90.

The output of the voltage controlled oscillator 94 is applied to a filter 97 via a buffer 96. The filter 97 filters out injurious spectra from the output of the voltage controlled oscillator 94 to obtain the high frequency sinusoidal signal at the terminal 19. Such a latest PLL circuit can easy deliver outputs of frequencies of 1 GHz to 2 GHz at the terminal 19.

In case the isolation circuit of the invention is used with a digital oscilloscope including a high repetition rate sampling clock for AD converters, the sampling clock is usable as the high frequency sinusoidal signal of the terminal 19.

The oscillator 18 is deliverable the output of 1 GHz. Therefore, the very small size unbalanced-to-balanced transformers 16 and 17, and isolation transformers 11 and 12 are employable.

For example, baluns for high frequency uses are usable as the unbalanced-to-balanced transformers 16 and 17. Conventional baluns very small in size for surface-mounting. Isolation transformers 11 and 12 are easy constructible by wires-wound small toroidal core. Therein, wires wound round the small toroidal core with a certain gap between the primary and secondary windings maintain voltage insulation.

Figure 6:
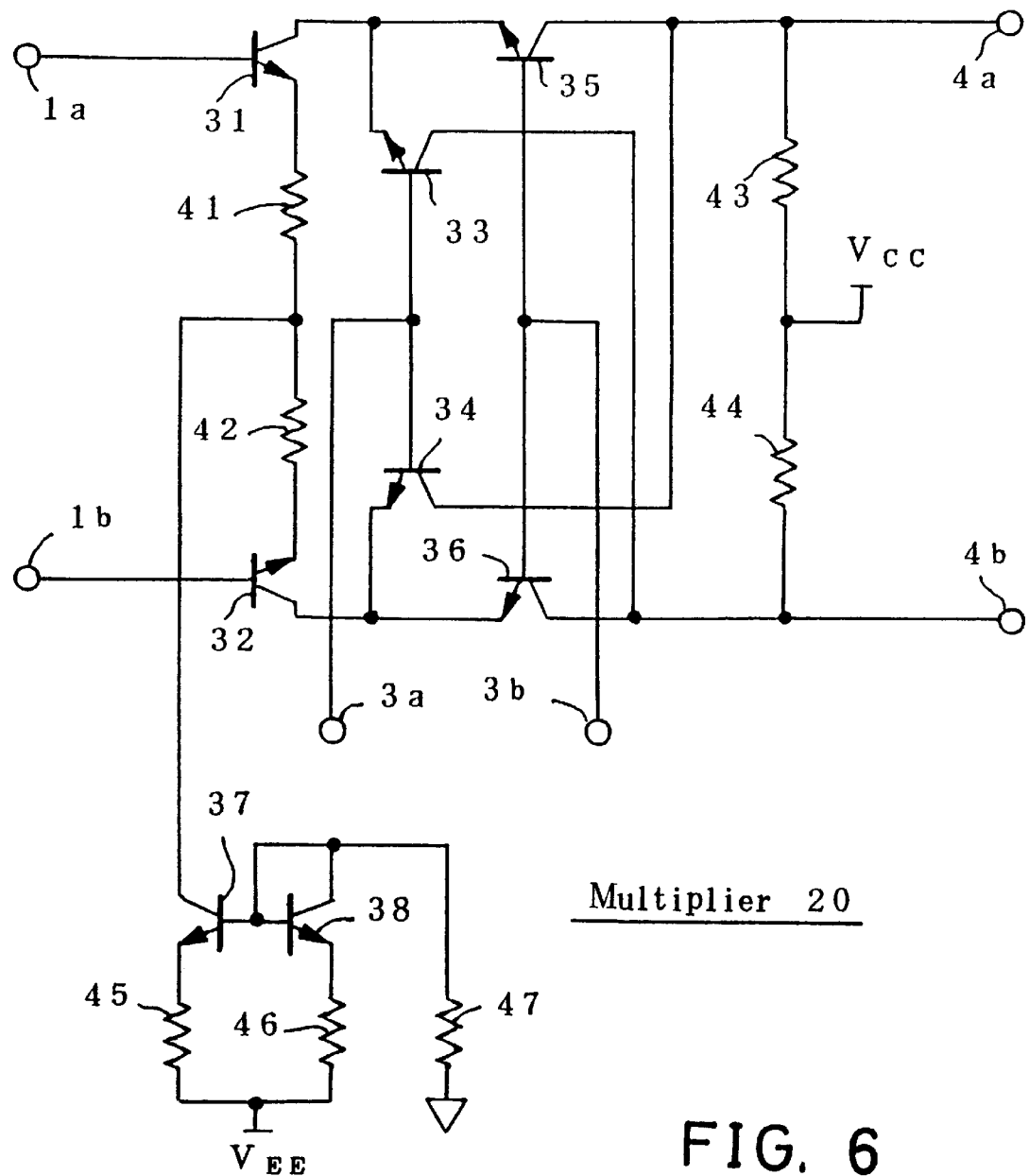
FIG. 6 is a circuit diagram of Gilbert type multiplier exemplifying a floating multiplier of FIG. 3 in accordance with the present invention.

FIG. 6 shows a circuit diagram of an embodiment of the floating multiplier 20. The circuit is well-known as Gilbert type multiplier which is easy integratable.

In FIG. 6, differential terminals 1a and 1b are respectively connected with bases of transistors 31 and 32 of a differential current amplifying stage. Their emitters are respectively connected with resistors 41 and 42 for negative feedback. The center junction of resistors 41 and 42 is connected to a floating negative power source $V_{EE}$ through a constant current, source.

The constant current source includes transistors 37 and 38, and resisters 45, 46 and 47. Transistors 37 and 38 construct a Miller current source. Resistors 45, 46 and 47 set the current value of the current source. Characteristics of cascaded transistors 33, 34, 35 and 36 must be matching. Therefore, it is desirably required that the Gilbert type multiplier 20 is a monolithic integrated circuit.

Emitters of transistors 33 and 35 are cascadedly connected with a collector of the transistor 31. In like manner, emitters of transistors 34 and 36 are cascadedly connected with a collector of the transistor 32. Base of transistors 33 and 35 are respectively connected with bases of transistors 34 and 36. Those connection points are terminals 3a and 3b.

Collectors of transistors 33 and 34 are respectively connected with collectors of transistors 36 and 35. Collectors of transistors 34 and 35 are connected to the floating positive power source $V_{CC}$ through a load resistor 43. Collectors of transistors 33 and 36 are connected to the floating positive power source $V_{CC}$ through a load resistor 44.

Transistors 31 to 38 construct the Gilbert type floating multiplier 20. The multiplier 20 multiplies the floating input signal between terminals 1a and 1b by the high frequency sinusoidal signal between terminals 3a and 3b to obtain the floating multiplied signal between terminals 4a and 4b.

A couple of collectors of transistors 34 and 35 and another couple of collectors of transistors 33 and 36 are respectively connected to bases of transistors 21 and 22 via terminals 4a and 4b as shown in FIG. 3. Collectors of transistors 21 and 22 are respectively connected to a floating positive power source $V_{CC}$. Those emitters are respectively connected to floating constant current sources 23 and 24 for forming emitter followers. Emitters of transistors 21 and 22 are connected to a primary winding of the isolation transformer 11.

Figure 7:
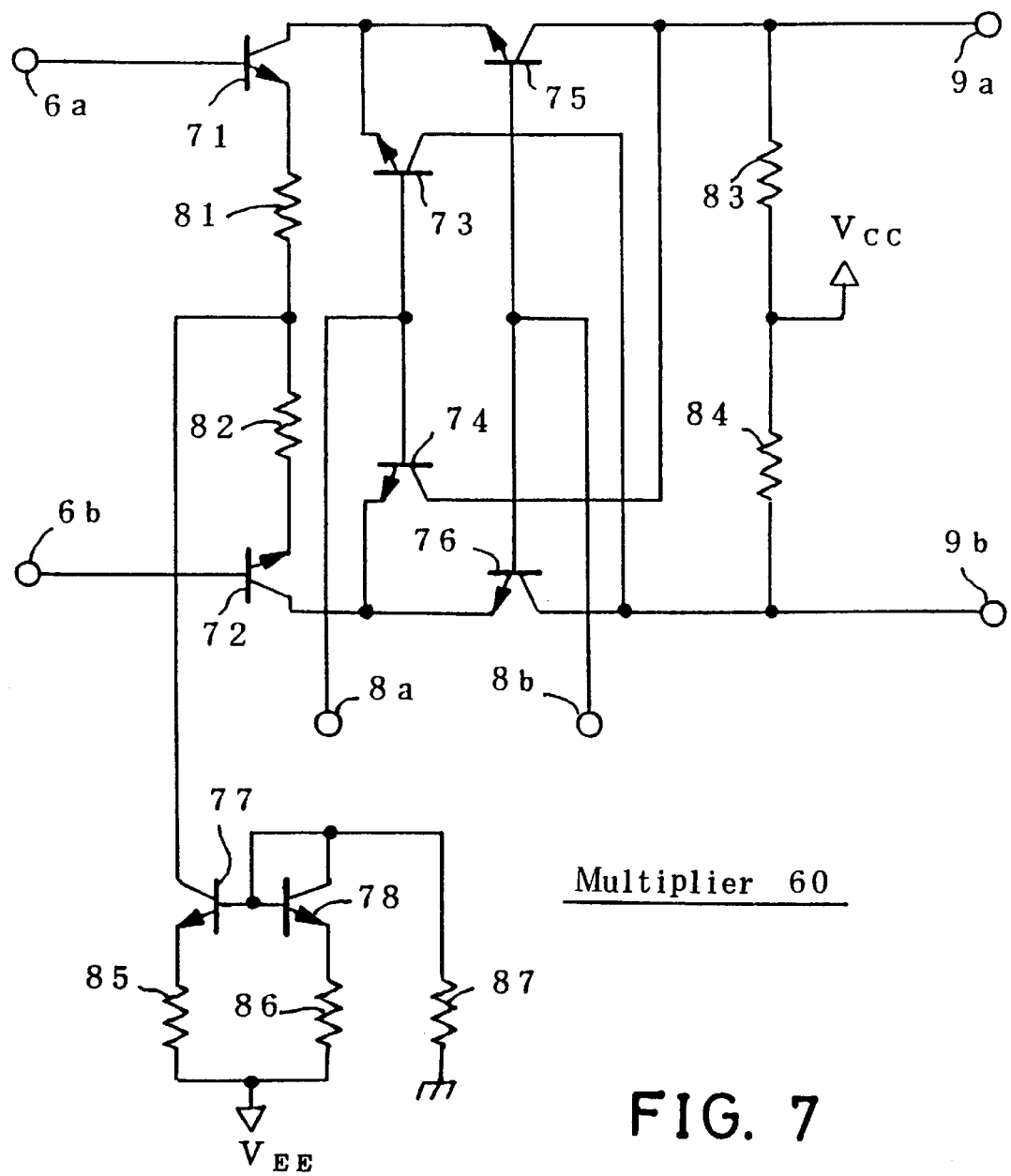
FIG. 7 is a circuit diagram of Gilbert type multiplier exemplifying a nonfloating multiplier of FIG. 3 in accordance with the present invention.

FIG. 7 shows a circuit diagram of an embodiment of the nonfloating multiplier 60 which is the same circuit as that of FIG. 6.

In FIG. 7, differential terminals 6a and 6b are respectively connected with bases of transistors 71 and 72 of a differential current amplifying stage. Their emitters are respectively connected with resistors 81 and 82 for negative feedback. The center junction of resistors 81 and 82 is connected to a nonfloating negative power source $V_{EE}$ through a constant current source.

The constant current source includes transistors 77 and 78, and resisters 85, 86 and 87. Transistors 77 and 78 construct a Miller current source. Resistors 85, 86 and 87 set the current value of the current source. Characteristics of cascaded transistors 73, 74, 75 and 76 must be matching. Therefore, it is desirably required that the Gilbert type multiplier 60 is a monolithic integrated circuit which is therefore the same circuit as that of the multiplier 20 of FIG. 6.

Emitters of transistors 73 and 75 are cascadedly connected with a collector of the transistor 71. In like manner, emitters of transistors 74 and 76 are cascadedly connected with a collector of the transistor 72. Base of transistors 73 and 75 are respectively connected with bases of transistors 74 and 76. Those connection points are terminals 8a and 8b.

Collectors of transistors 73 and 74 are respectively connected with collectors of transistors 76 and 75. Collectors of transistors 74 and 75 are connected to the nonfloating positive power source $V_{CC}$ through a load resistor 83. Collectors of transistors 73 and 76 are connected to the nonfloating positive power source $V_{CC}$ through a load resistor 84.

Transistors 71 to 78 construct the Gilbert type nonfloating multiplier 60. The multiplier 60 multiplies the nonfloating input signal between terminals 6a and 6b by the high frequency sinusoidal signal between terminals 8a and 8b to obtain the nonfloating multiplied signal between terminals 9a and 9b.

A couple of collectors of transistors 74 and 75 and another couple of collectors of transistors 73 and 76 are respectively connected to bases of transistors 61 and 62 via terminals 9a and 9b as shown in FIG. 3. Collectors of transistors 61 and 62 are respectively connected to a nonfloating positive power source $V_{CC}$. Those emitters are respectively connected to nonfloating constant current sources 63 and 64 for forming emitter followers. Emitters of transistors 61 and 62 are respectively connected to output terminals 2a and 2b through low-pass filters 67 and 68.

Figure 8:
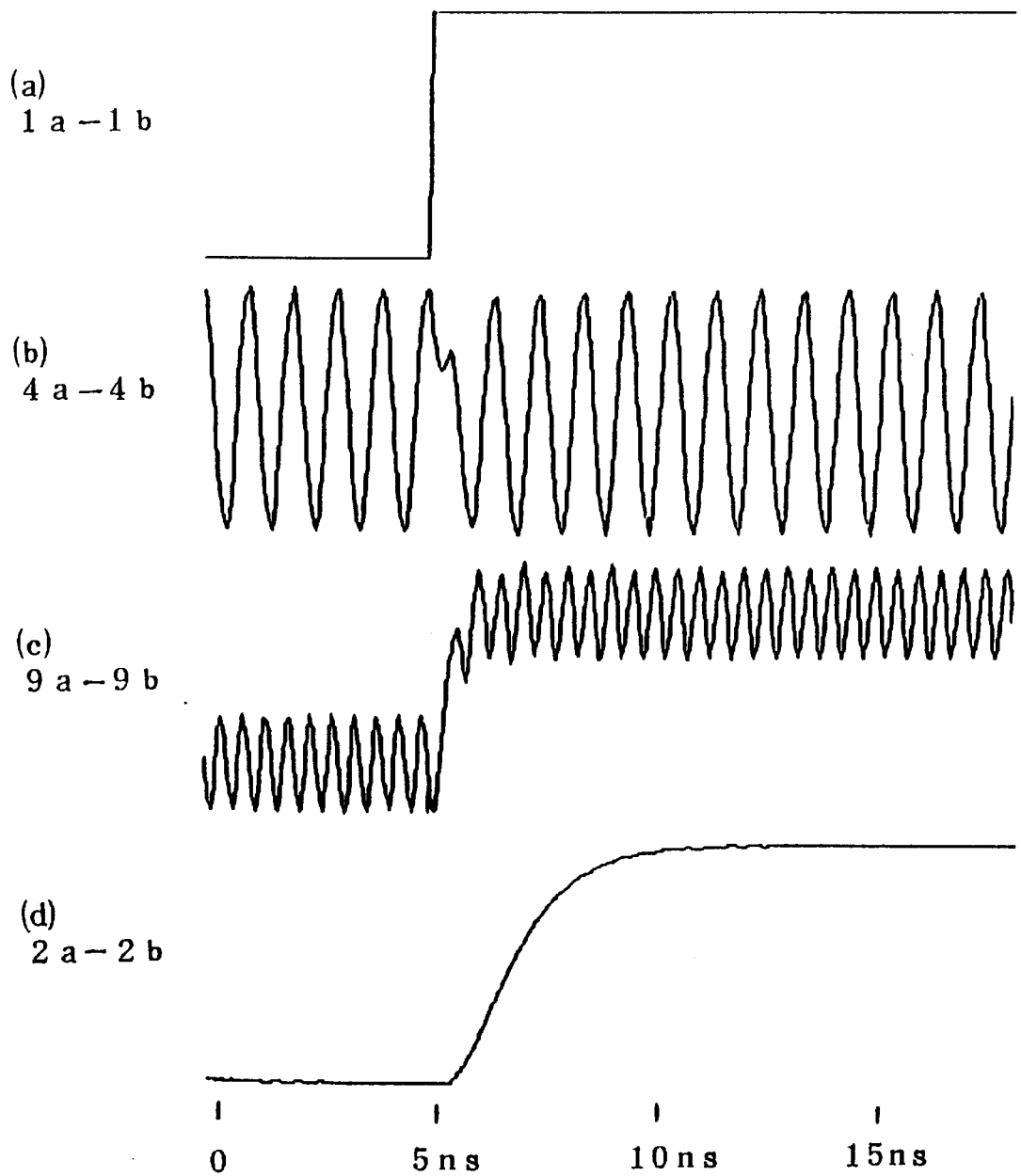
FIG. 8 is a chart of simulated waveforms of the circuit responses for a step input in FIG. 3 according to the present invention.

FIG. 8 shows waveforms of various portions of FIG. 3 by a simulation. The 5 ns time scale is used. Therein, the input signal is a step function, an oscillation frequency of the oscillator 18 is 1 GHz, and a cutoff frequency of low-pass filters 67 and 68 is 100 MHz.

FIG. 8(*a*) indicates the step function of differential input between terminals 1a and 1b, (*b*) identifies a floating multiplied output between terminals 4a and 4b, (*c*) denotes a nonfloating multiplied output between terminals 9a and 9b, and (*d*) designates a nonfloating differential output between terminals 2a and 2b.

FIG. 8 shows clearly that the floating side at the left of isolation transformers 11 and 12 is isolated from the nonfloating side at the right of isolation transformers 11 and 12 of FIG. 3 so as to obtain nonfloating reproduced analog signal from the floating analog signal without wave distortions.

Figure 9:
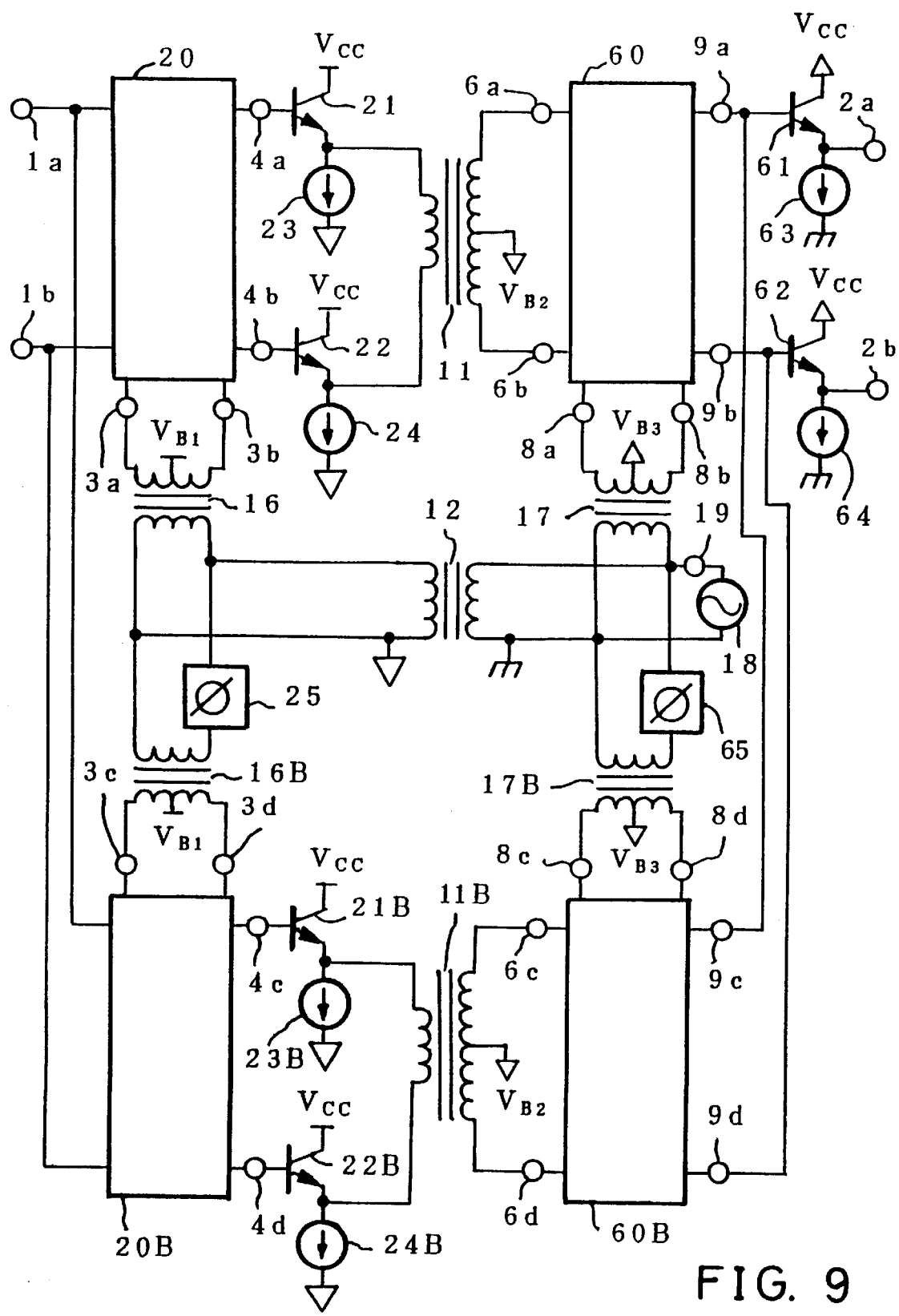
FIG. 9 is a schematic diagram of another embodiment of an isolation circuit in accordance with the present invention.

FIG. 9 shows a schematic diagram of the second embodiment of an isolation circuit of the invention. In FIG. 9, elements similar to those previously described with reference to FIG. 3 are denoted by the same reference numerals. The circuit of FIG. 9 includes two paths. The first path is the same circuit as that of FIG. 3. The adapted second path has multipliers 20B and 60B in like manner with the first path.

The multiplier 20B is the same circuit as that of the multiplier 20 shown in FIG. 6. Therein, characters of terminals 3a and 3b, and 4a and 4b are respectively replaced by 3c and 3d, and 4c and 4d.

The multiplier 60B is the same circuit as that of the multiplier 60 shown in FIG. 7. Therein, characters of terminals 6a and 6b, 8a and 8b, and 9a and 9b are respectively replaced by 6c and 6d, 8c and 8d, and 9c and 9d.

The oscillator 18 delivers a high frequency sinusoidal signal to a terminal 19. The signal is phase-shifted by 90 degrees through a phase-shifter 65. The phase-shifted signal is applied as a high frequency cosine signal to the multiplier 60B via an unbalanced-to-balanced transformer 17B.

The high frequency sinusoidal signal of the terminal 19 is phase-shifted by 90 degrees through an isolation transformer 12 and a phase-shifter 25, too. The floating phase-shifted signal is applied as a cosine signal to the multiplier 20B through a unbalanced-to-balanced transformer 16B.

The inputs of the multiplier 20B are connected to the input terminals 1a and 1b. The floating multiplier 20B multiplies the differential input signal from terminals 1a and 1b by the floating phase-shifted signal so as to obtain a floating multiplied signal between terminals 4c and 4d.

The terminal 4c is connected to an emitter follower consisting of a transistor 21B and a constant current source 23B. The terminal 4d is connected to an emitter follower consisting of a transistor 22B. The floating multiplied signal is applied to the nonfloating multiplier 60B through emitter followers and an isolation transformer 11B.

The multiplier 60B multiplies the output signal of the multiplier 20B by the phase-shifted signal of terminals 8c and 8d so as to obtain a nonfloating multiplied signal between terminals 9c and 9d.

Thereby, terminals 9c and 9d of the second path output are respectively connected with terminals 9a and 9b of the first path output so as to obtain an added signal. There are two emitter followers individually consisting of a transistor 61 and a constant current 63, and a transistor 62 and a constant current source 64. The added signal is obtained between output terminals 2a and 2b.

Figure 10:
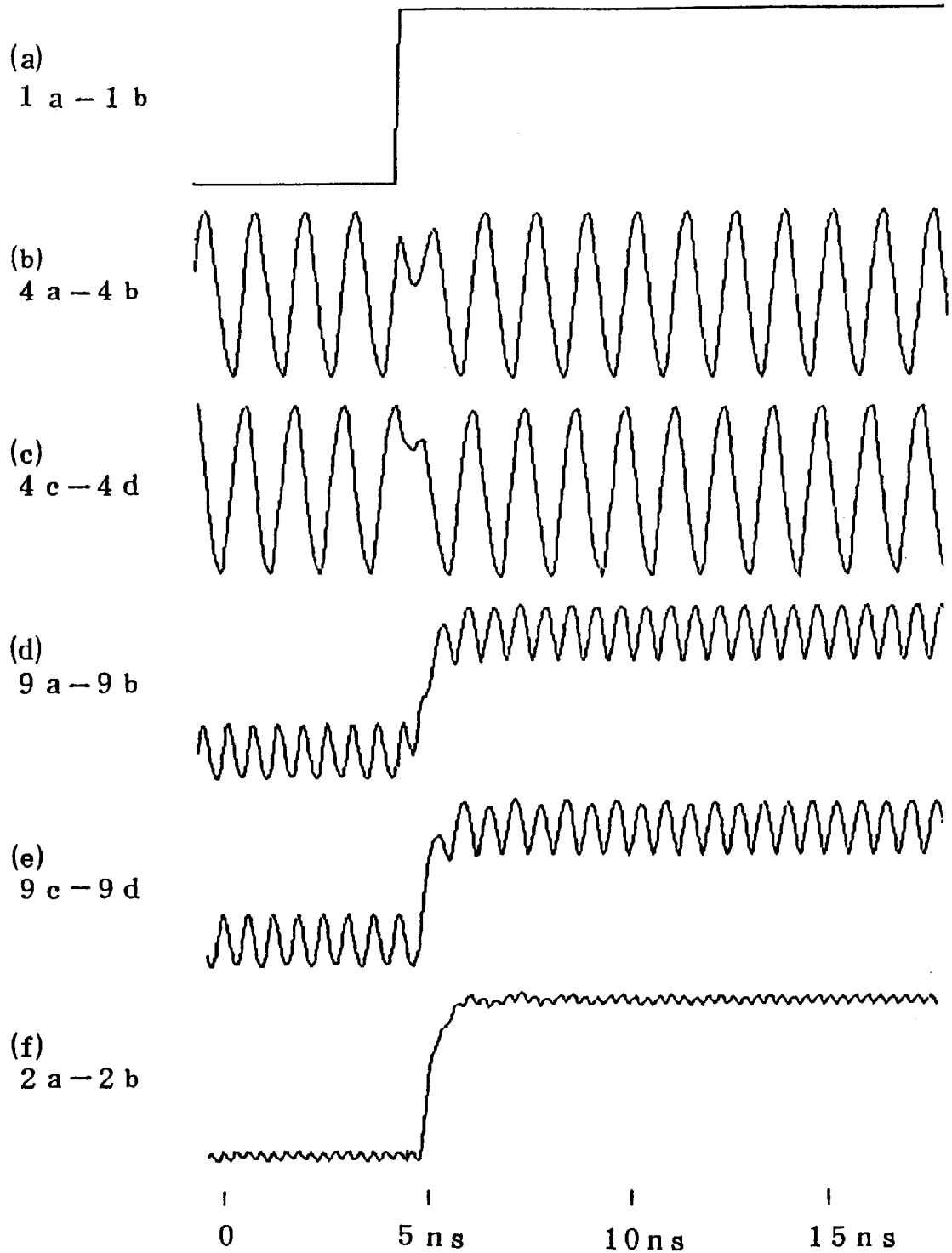
FIG. 10 is a chart of simulated waveforms of the circuit responses for a step input in FIG. 9 according to the present invention.

FIG. 10 shows waveforms of various portions of FIG. 9 by a simulation in like manner of FIG. 8. Therein, the 5 ns time scale is used and Y axes show arbitrary voltage scales. The oscillator 18 oscillates a 1 GHz sinusoidal signal.

FIG. 10(a) indicates a step function of differential input between terminals 1a and 1b, (b) identifies a floating multiplied output between terminals 4a and 4b, (c) denotes another floating multiplied output between terminals 4c and 4d, (d) designates the first path nonfloating multiplied output between terminals 9a and 9b, (e) represents the second path nonfloating multiplied output between terminals 9c and 9d, and (f) shows an added signal between terminals 2a and 2b.

Waveforms of (a) to (f) are respectively representable as $E_a$ to $E_f$ using following equations.

$$E_a = f(t) \tag{5}$$

$$E_b = E_a \sin(\omega t) = f(t) \sin(\omega t) \tag{6}$$

$$E_c = E_a \cos(\omega t) = f(t) \cos(\omega t) \tag{7}$$

$$E_d = E_b \sin(\omega t) = f(t) \sin^2(\omega t) \tag{8}$$

$$E_e = E_c \cos(\omega t) = f(t) \cos^2(\omega t) \tag{9}$$

$$E_f = f(t)(\sin^2(\omega t) + \cos^2(\omega t)) = f(t) \tag{10}$$

Equation (10) shows a waveform reproduced from an input waveform of Equation (5). The waveform of Equation (10) includes no high frequency sinusoidal ingredient. Low-pass filters as low-pass filters 67 and 68 of FIG. 3 are not required.

In a practical circuit, there is a little possibility that the reproduced waveform includes a little bit of a high frequency sinusoidal ingredient as shown in FIG. 10(f), because of a limited frequency bandwidth of the circuit and its nonlinearity.

However, the high frequency sinusoidal ingredient is easy filterable by optionally using low-pass filters of which cutoff characters are looser than those of filters 67 and 68 without influence to the signal f(t).

Figure 11:
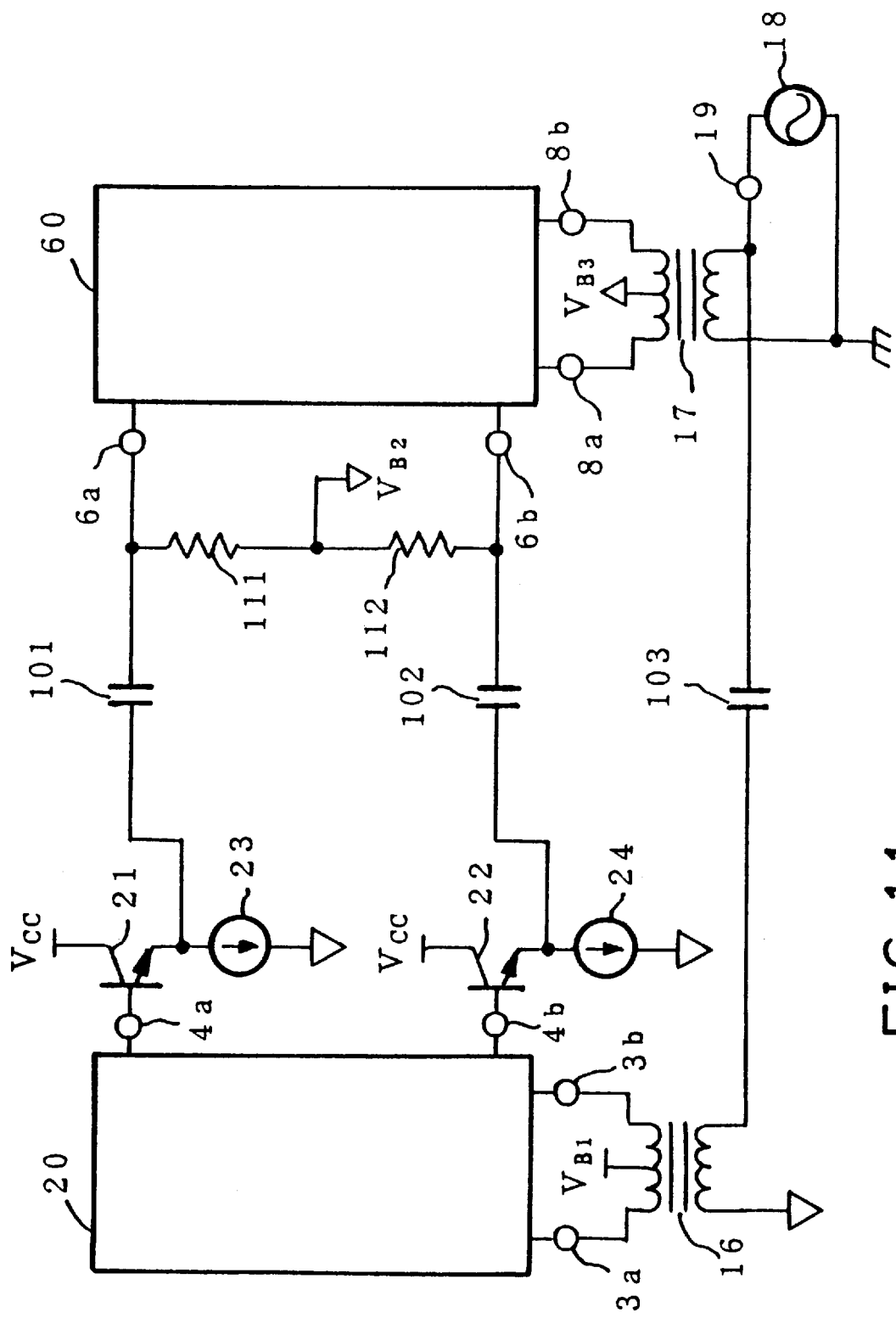
FIG. 11 is a schematic diagram showing principal portion of the third embodiment of an isolation circuit in accordance with the present invention.

FIG. 11 shows a circuit diagram of the principal part of the third embodiment of the invention. In FIG. 11, elements similar to those previously described with reference to FIG. 3 are denoted by the same reference numerals. Therefore, the different portions from those of FIG. 3 will be described.

There are capacitors 101 and 102 between multiplier 20 and 60 in FIG. 11. There is a capacitor 103 between the oscillator 18 and the unbalanced-to-balanced transformer 16. Capacitances of capacitors 101, 102 and 103 are set as small as signals are not attenuated. It is easy understandable that capacitors 101, 102 and 103 insulates lower frequency signals than cutoff frequencies of capacitors 101, 102 and 103. The circuit of FIG. 11 is easy applicable to the second embodiment of FIG. 9, too.

Figure 12:
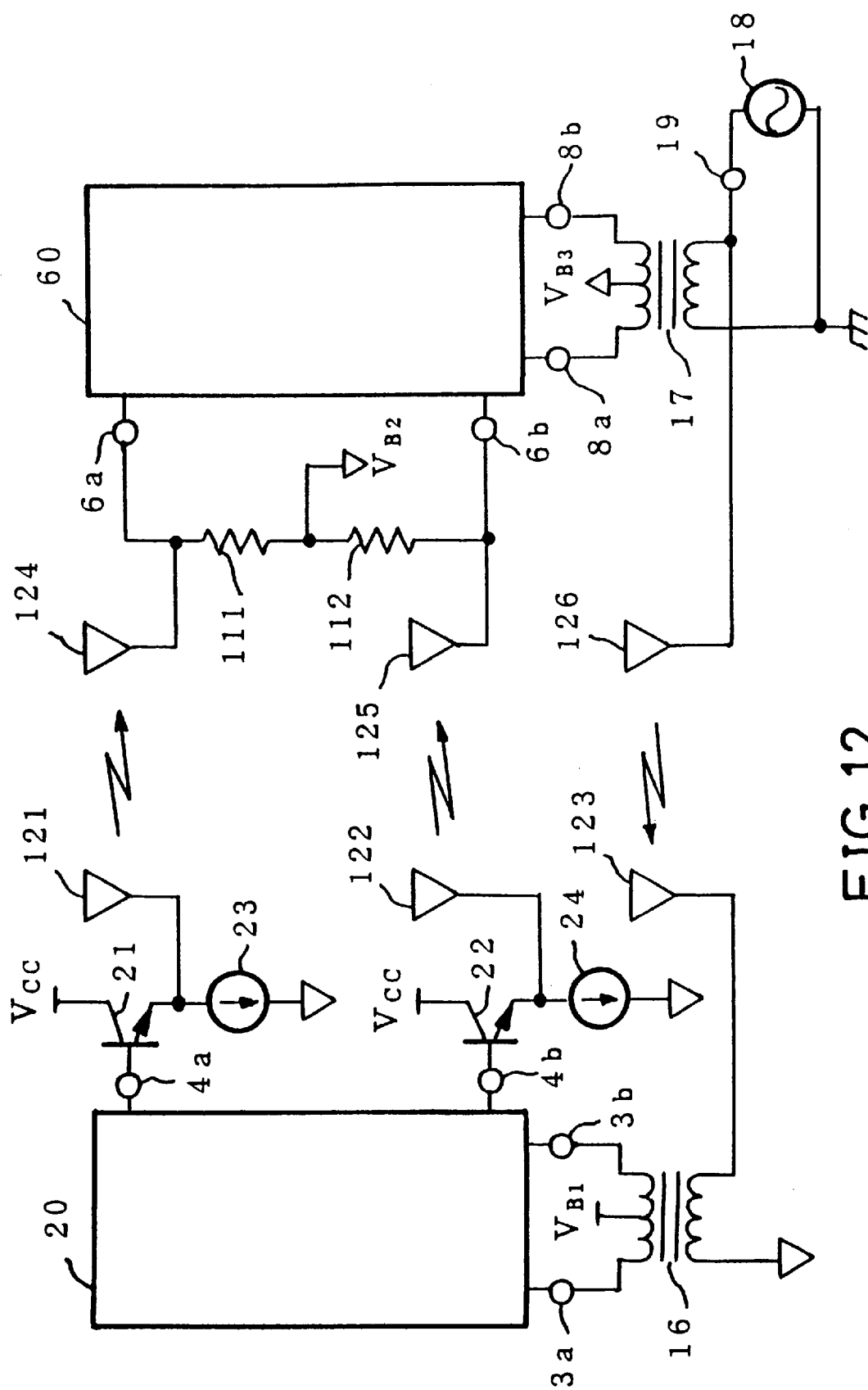
FIG. 12 is a schematic diagram showing principal portion of the fourth embodiment of an isolation circuit in accordance with the present invention.

FIG. 12 shows a circuit diagram of the principal part of the fourth embodiment of the invention. In FIG. 12, elements similar to those previously described with reference to FIG. 3 are denoted by the same reference numerals. Therefore, the different portions from those of FIG. 3 will be described.

Two pairs of antennas 121 and 124, and 122 and 125 connect the multiplier 20 with the multiplier 60. Another pair of antennas 126 and 123 connect the oscillator 18 to the unbalanced-to-balanced transformer 16. It is clearly understandable that the isolation distance is long enough to obtain large insulation voltage. The circuit of FIG. 12 is easy applicable to the second embodiment of FIG. 9, too.

Figure 13:
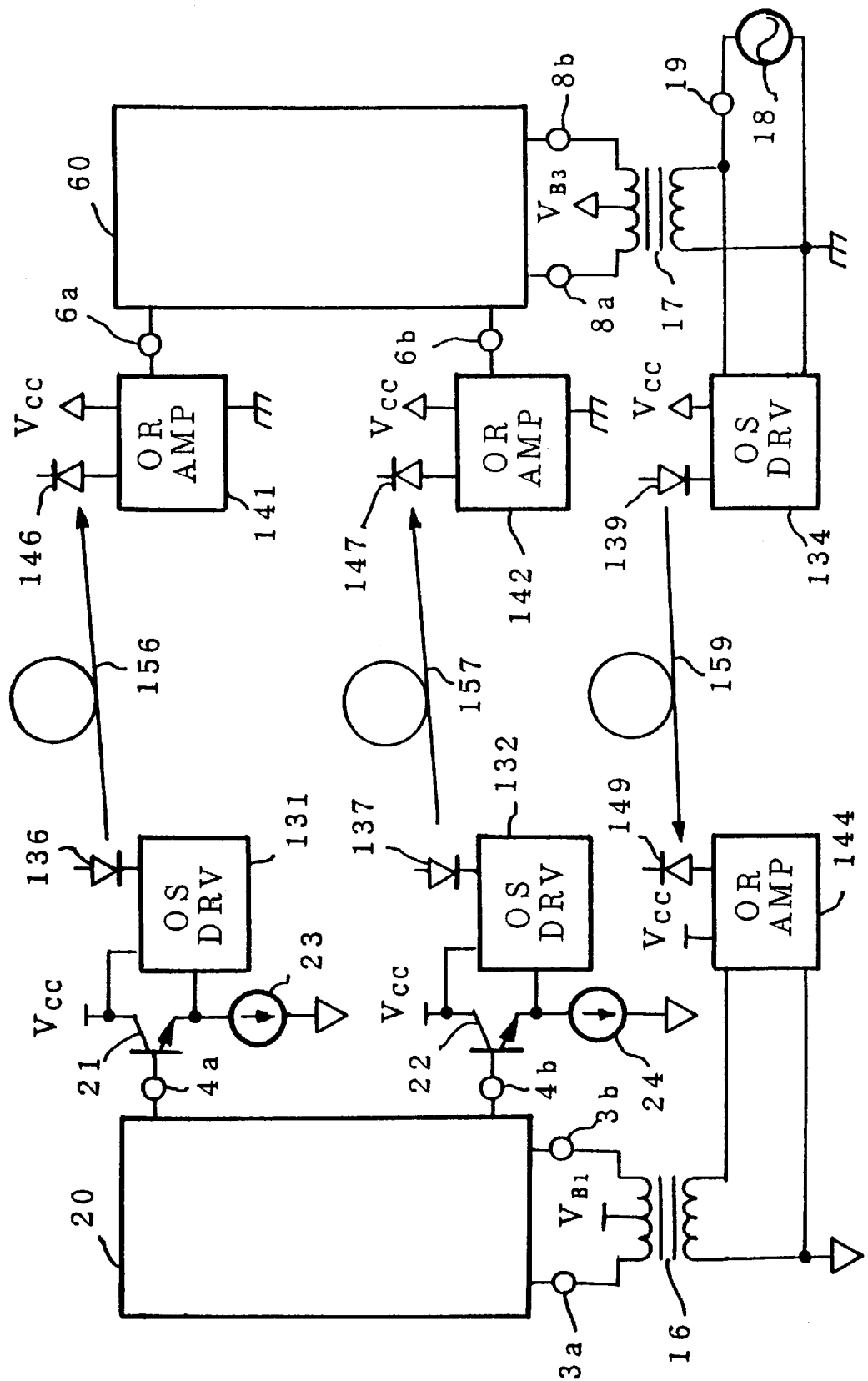
FIG. 13 is a schematic diagram showing principal portion of the fifth embodiment of an isolation circuit in accordance with the present invention.

FIG. 13 shows a circuit diagram of the principal part of the fifth embodiment of the invention. In FIG. 13, elements similar to those previously described with reference to FIG. 3 are denoted by the same reference numerals. Therefore, the different portions from those of FIG. 3 will be described.

The multiplier 20 of FIG. 13 sends the output to optical sending drivers 131 and 132 via emitter followers consisting of transistors 21 and 22. Light emitting elements 136 and 137 emit respectively optical signals to optical receiving elements 146 and 147 through optical fibers 156 and 157.

Signals received by elements 146 and 147 are respectively amplified by optical receiving amplifiers 141 and 142. The amplified signals from the amplifiers 141 and 142 are applied to input terminals 6a and 6b of the multiplier 60.

The high frequency sinusoidal signal from the oscillator 18 is applied to an optical sending driver 134. A light emitting element 139 sends an optical high frequency sinusoidal signal to an optical receiving element 149 via an optical fiber 159.

An optical receiving amplifier 144 amplifies the signal received by the element 149. The signal amplified by the amplifier 144 is applied to a unbalanced-to-balanced transformer 16.

Figure 14:
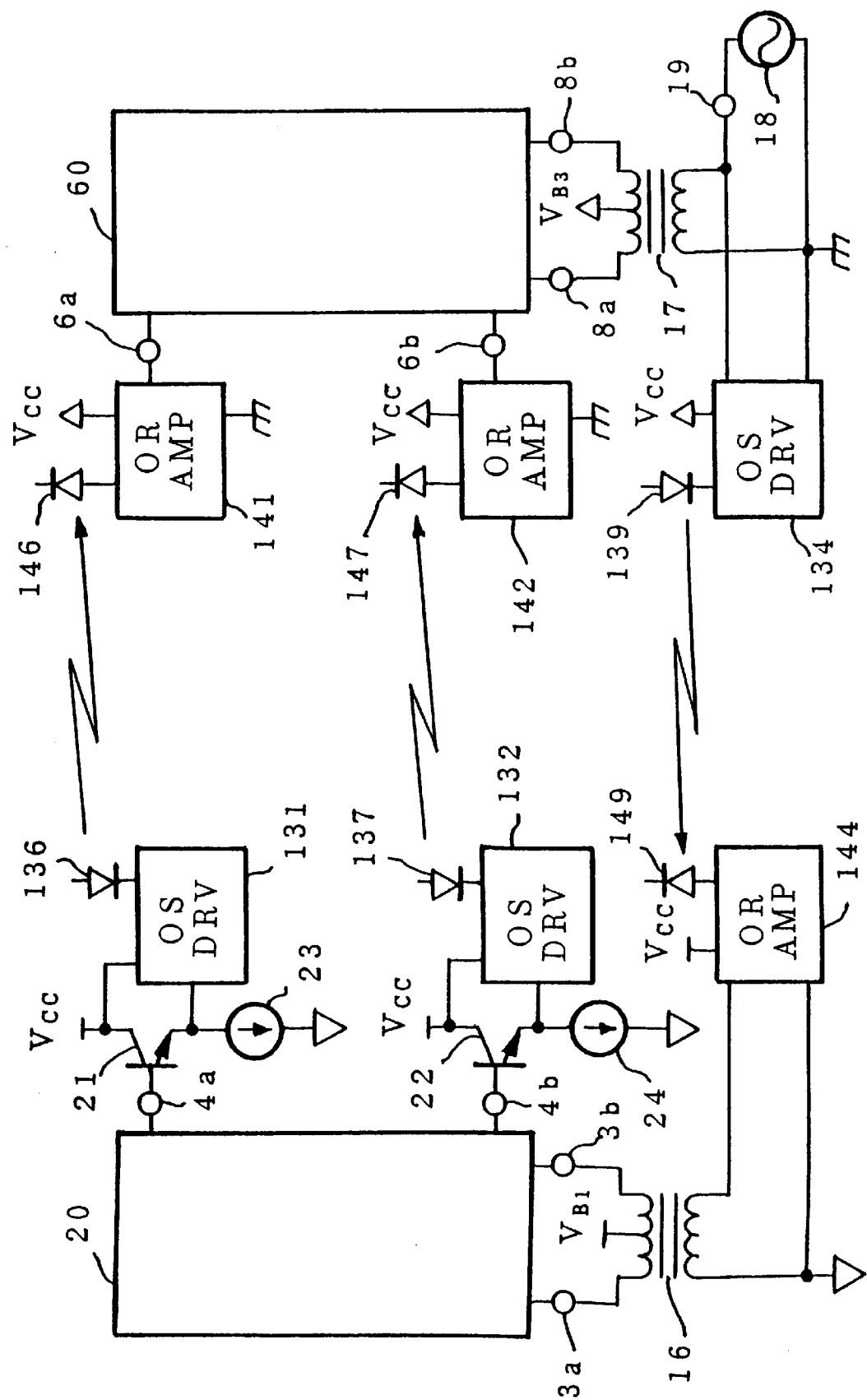
FIG. 14 is a schematic diagram showing principal portion of the sixth embodiment of an isolation circuit in accordance with the present invention.

FIG. 14 shows a circuit diagram of the principal part of the sixth embodiment of the invention. In FIG. 14, elements similar to those previously described with reference to FIG. 3 are denoted by the same reference numerals. Therefore, the different portions from those of FIG. 3 will be described.

The multiplier 20 of FIG. 14 sends the output to optical sending drivers 131 and 132 via emitter followers consisting of transistors 21 and 22. Light emitting elements 136 and 137 emit respectively optical signals to optical receiving elements 146 and 147 by space transmission.

Signals received by elements 146 and 147 are respectively amplified by optical receiving amplifiers 141 and 142. The amplified signals from the amplifiers 141 and 142 are applied to input terminals 6a and 6b of the multiplier 60.

The high frequency sinusoidal signal from the oscillator 18 is applied to an optical sending driver 134. A light emitting element 139 sends an optical high frequency sinusoidal signal to an optical receiving element 149 by space transmission.

An optical receiving amplifier 144 amplifies the signal received by the element 149. The signal amplified by the amplifier 144 is applied to a unbalanced-to-balanced transformer 16.

The simple circuit of the invention including Gilbert type multipliers suitable for the monolithic integrated circuitrize is applicable the signal reproduced from the floating large bandwidth signal of DC to 100s MHz or more. In the circuit, miniature transformers are employable instead of large sized transformers for low frequency use. Accordingly, it is the merit of the invention that the circuit is suitable for miniaturize and obtaining a much larger bandwidth characteristics than those of the prior art. The circuit has no crossover distortion, in spite of the fact that the prior art circuit (U.S. Pat. No. 5,517,154) has a crossover distortion. The high frequency sinusoidal oscillator of 1 or 2 GHz and antenna or optical transmissions are usable to obtain high voltage large bandwidth signal isolation.

While the invention has been described in its preferred embodiments, it is to be understood that within the scope of the appended claims the invention can be practiced otherwise than as specifically described.

What is claimed is:

1. A large bandwidth analog isolation circuit comprising:
   a floating multiplying means (20) for multiplying a floating analog input signal (1a, 1b) by a floating high frequency sinusoidal signal (3a, 3b) to obtain a floating multiplied signal (4a, 4b) in a floating side,
   isolation means (11, 101, 102, 121, 122, 124, 125, 131, 136, 156, 146, 141, 132, 137, 157, 147, 142) for isolating a nonfloating side from the floating side to obtain the isolated floating multiplied signal as a nonfloating input signal (6a, 6b) in the nonfloating side, a nonfloating multiplying means (60) for multiplying the nonfloating input signal (6a6b) by a nonfloating high frequency sinusoidal signal (8a, 8b) to obtain a nonfloating multiplied signal (9a, 9b) in the nonfloating side, low-pass filters (67, 68) for filtering out high frequency spectra of the nonfloating high frequency sinusoidal signal to obtain a nonfloating analog signal (2a, 2b) reproduced from the floating analog input signal (1a, 1b), an oscillating means (18) for oscillating the nonfloating high frequency sinusoidal signal, and sinusoidal signal isolation means (12, 103, 126, 123, 134, 139, 159, 149, 144) for isolating the nonfloating side from the floating side to obtain an isolated nonfloating high frequency sinusoidal signal as the floating high frequency sinusoidal signal.

2. A large bandwidth analog isolation circuit according to claim 1, wherein the floating and nonfloating multiplying means (20, 60) comprise Gilbert type multipliers.

3. A large bandwidth analog isolation circuit according to claim 1, wherein the isolation means and the sinusoidal signal isolation means comprise isolation transformers (11, 12).

4. A large bandwidth analog isolation circuit according to claim 1, wherein the isolation means and the sinusoidal signal isolation means comprise capacitors (101, 102, 103).

5. A large bandwidth analog isolation circuit according to claim 1, wherein the isolation means and the sinusoidal signal isolation means comprise facing antennas (121, 124, 122, 125, 126, 123).

6. A large bandwidth analog isolation circuit according to claim 1, wherein the isolation means and the sinusoidal signal isolation means comprise facing means optically sending and receiving through optical fibers (131, 136, 156, 146, 141, 132, 137, 157, 147, 142, 134, 139, 159, 149, 144).

7. A large bandwidth analog isolation circuit according to claim 1, wherein the isolation means and the sinusoidal signal isolation means comprise facing means optically sending and receiving through space (131, 136, 146, 141, 132, 137, 147, 142, 134, 139, 149, 144).

8. A large bandwidth analog isolation circuit comprising:

a first floating multiplying means (20) for multiplying a floating analog input signal (1a, 1b) by a floating high frequency sinusoidal signal (3a, 3b) to obtain a first floating multiplied signal (4a, 4b) in a floating side, a first isolation means (11, 101, 102, 121, 122, 124, 125, 131, 136, 156, 146, 141, 132, 137, 157, 147, 142) for isolating a nonfloating side from the floating side to obtain the first isolated floating multiplied signal as a first nonfloating input signal (6a, 6b) in the nonfloating side, a first nonfloating multiplying means (60) for multiplying the first nonfloating input signal (6a, 6b) by a nonfloating high frequency sinusoidal signal (8a, 8b) to obtain a first nonfloating multiplied signal (9a, 9b) in the nonfloating side, a second floating multiplying means (20B) for multiplying a floating analog input signal (1a, 1b) by a floating high frequency cosine signal (3c, 3d) to obtain a second floating multiplied signal (4c, 4d) in the floating side, a second isolation means (11B, 101, 102, 121, 122, 124, 125, 131, 136, 156, 146, 141, 132, 137, 157, 147, 142) for isolating the nonfloating side from the floating side to obtain the second isolated floating multiplied signal as a second nonfloating input signal (6c, 6d) in the nonfloating side, a second nonfloating multiplying means (60B) for multiplying the second nonfloating input signal (6c, 6d) by a nonfloating high frequency cosine signal (8c, 8d) to obtain a second nonfloating multiplied signal (9c, 9d) in the nonfloating side, a multiplied signal adding means (61, 62) for adding the first and second nonfloating multiplied signals (9a, 9b, 9c, 9d,) to obtain an added nonfloating multiplied signal (2a, 2b) in the nonfloating side, an oscillating means (18) for oscillating the nonfloating high frequency sinusoidal signal (19), and sinusoidal signal isolation means (12, 25, 65, 103, 126, 123, 134, 139, 159, 149, 144) for isolating the nonfloating side from the floating side to obtain an isolated nonfloating high frequency sinusoidal signal as the floating high frequency sinusoidal signal (3a, 3b) and the floating high frequency cosine signal (3c, 3d) and to obtain the nonfloating high frequency sinusoidal and cosine signal (8a, 8b, 8c, 8d) from the nonfloating high frequency sinusoidal signal (19).

9. A large bandwidth analog isolation circuit according to claim 8, wherein the first and second floating and nonfloating multiplying means (20, 20B, 60, 60B) comprise Gilbert type multipliers.

10. A large bandwidth analog isolation circuit according to claim 8, wherein the first and second isolation means and the sinusoidal signal isolation means comprise isolation transformers (11, 11B, 12).

11. A large bandwidth analog isolation circuit according to claim 8, wherein the first and second isolation means and the sinusoidal signal isolation means comprise capacitors (101, 102, 103).

12. A large bandwidth analog isolation circuit according to claim 8, wherein the first and second isolation means and the sinusoidal signal isolation means comprise facing antennas (121, 124, 122, 125, 126, 123).

13. A large bandwidth analog isolation circuit according to claim 8, wherein the first and second isolation means and the sinusoidal signal isolation means comprise facing means optically sending and receiving through optical fibers (131, 136, 156, 146, 141, 132, 137, 157, 147, 142, 134, 139, 159, 149, 144).

14. A large bandwidth analog isolation circuit according to claim 8, wherein the first and second isolation means and the sinusoidal signal isolation means comprise facing means optically sending and receiving through space (131, 136, 146, 141, 132, 137, 147, 142, 134, 139, 149, 144).

* * * * *